US012690125B2

(12) United States Patent
Albrecht et al.

(10) Patent No.: US 12,690,125 B2
(45) Date of Patent: Jul. 21, 2026

(54) PRINTED CIRCUIT BOARD ASSEMBLY

(71) Applicant: Mettler-Toledo GmbH, Greifensee (CH)

(72) Inventors: Wendelin Albrecht, Feusisberg (CH); Stefan Wyss, Maur (CH)

(73) Assignee: Mettler-Toledo GmbH, Greifensee (CH)

( * ) Notice: Subject to any disclaimer, the term of this patent is extended or adjusted under 35 U.S.C. 154(b) by 208 days.

(21) Appl. No.: 18/652,893

(22) Filed: May 2, 2024

(65) Prior Publication Data

US 2024/0397614 A1 Nov. 28, 2024

(30) Foreign Application Priority Data

May 24, 2023 (EP) ..................................... 23175182

(51) Int. Cl.
*H05K 1/00* (2006.01)
*H05K 1/02* (2006.01)
*H05K 1/181* (2026.01)

(52) U.S. Cl.
CPC ........... *H05K 1/0271* (2013.01); *H05K 1/181* (2013.01); *H05K 2201/09072* (2013.01); *H05K 2201/10151* (2013.01); *H05K 2201/10659* (2013.01)

(58) Field of Classification Search
CPC ................. H05K 1/0271; H05K 1/181; H05K 2201/09072; H05K 2201/10151; H05K 2201/10659
See application file for complete search history.

(56) References Cited

U.S. PATENT DOCUMENTS 4,641,222 A 2/1987 Derfiny et al.
9,078,358 B2 7/2015 Toratani et al.

FOREIGN PATENT DOCUMENTS

| CN | 112838743 | A | * | 5/2021 | .............. H02M 1/32 |
| DE | 19810060 | A1 | * | 11/1998 | .......... H01L 21/563 |
| EP | 0083265 | A1 | | 7/1983 | |
| JP | 2014-56992 | A | | 3/2014 | |
| WO | WO-2018172137 | A1 | * | 9/2018 | .......... H05K 3/3436 |

* cited by examiner

*Primary Examiner* — Pete T Lee
(74) *Attorney, Agent, or Firm* — Standley Law Group LLP; Jeffrey S. Standley; Adam J. Smith

(57) ABSTRACT

Printed circuit board (PCB) assembly includes a printed circuit board, an electronic component mounted on the PCB at a mounting portion thereof. The electronic component includes a plurality of electrical connection terminals for soldering to corresponding connection locations of the PCB. The mounting portion has an aperture facing the electronic component mounted on the PCB. At least one of the terminals is unconnected and the aperture extends into a region of the PCB that faces the at least one unconnected terminal.

10 Claims, 3 Drawing Sheets

PRINTED CIRCUIT BOARD ASSEMBLY

CROSS-REFERENCE TO RELATED APPLICATIONS

This application claims the benefit of European Patent Application No. 23175182.7 filed May 24, 2023, the disclosures of which are hereby incorporated by reference as if fully restated herein.

TECHNICAL FIELD

Exemplary embodiments relate generally to a printed circuit board (PCB) assembly comprising a printed circuit board (PCB); an electronic component mounted on the PCB at a mounting portion thereof, the electronic component having a plurality of electrical connection terminals for soldering to corresponding connection locations of the PCB and the mounting portion having an aperture facing the electronic component mounted on the PCB.

BACKGROUND AND SUMMARY OF THE INVENTION

In printed circuit board assemblies of the above referenced type the printed circuit board (PCB) has a tendency to expand by the absorption of humidity, e.g., environmental humidity and/or heat, e.g., heat dissipated from the electronic component. Since this expansion behavior is generally different from the one of the electronic component and since the latter one has its electrical connection terminals fixedly soldered to the connection locations on the PCB, mechanical stresses may occur in the components' connection terminals and may thereby cause an instability of the components' electrical characteristics. This is specifically undesirable for components serving as a voltage reference for an electronic measurement sensor, specifically a load cell.

To alleviate this problem, the aperture in the mounting portion has been provided in prior art proposals in order to reduce dissipation of heat into the PCB. There are, however, applications where the improvement that is attained by the provision of this aperture is not sufficient.

It is thus an object of the present invention to provide a printed circuit board assembly of the above referenced type in which the electrical stability is further improved.

In accordance with the invention, this object is obtained with a printed circuit board assembly of the before referenced type, wherein at least one of the terminals is unconnected and the aperture extends into a region of the PCB that faces the at least one unconnected terminal.

Electronic components designed for mounting on a printed circuit board (PCB) normally have the electrical connection terminals thereof arranged in linear rows with only a small distance between neighboring terminals of the row. The inventors have recognized that stress on the terminals because of different expansions of the PCB and the component as a result of an exposure to heat and/or humidity could theoretically be reduced by the provision of separating slots at the mounting portion of the PCB that extend between corresponding connection locations of the PCB. This is, however, practically not feasible since the distance between neighboring connection locations of the PCB is as small as the distance between the facing connection terminals of the component, and this small distance would not allow to cut the slots with available PCB to link equipment. At the same time, the inventors have considered that in many applications one or more connection terminals of the electronic component have not assigned an electrical function thereto so that there is from a perspective of electrical function no need to solder these terminals to the corresponding connection locations of the PCB. According to the invention, at least one of the terminals having no electrical function is not soldered to the corresponding connection location of the PCB and the aperture of the PCB is configured to extend into a region of the PCB that faces the at least one unconnected terminal. In this way, the aperture may extend over the whole width between second nearest connection locations on the PCB and may thus be easily machined with available PCB machining tools.

In an advantageous embodiment of the printed circuit board assembly, the electrical connection terminals are arranged along the four sides of a rectangle with a first unconnected terminal located on a center line between two opposing sides of the rectangle and second and third unconnected terminals located opposite to each other in a direction that is orthogonal to the center line, and the aperture comprises first, second and third proximally contiguous branches distally facing the first, second and third unconnected terminals, respectively. In particular, each of the first, second and third branches may extend along a first, second and third rectilinear center line, respectively, having a constant width in the orthogonal direction thereto. The distal end portions of the first, second and third branches, respectively, may extend outwardly beyond the area of the PCB that faces the rectangle. The first center line of the first branch may coincide with the center line between the opposing sides of the rectangle and the second and third center lines may intersect in one single intersection point. Further, the angles between the center line between the opposing sides of the rectangle and the second and third rectilinear center lines, respectively, may be the same. In this way, when these angles are essentially 90°, the first, second and third rectilinear center lines are in the shape of a T. When these angles are less than 90°, the first, second and third rectilinear center lines are in the shape of a Y.

In expedient embodiments, the second and third unconnected terminals may be each located adjacent to a corner of the rectangle. Further, each of the two opposing sides may have three terminals equidistantly located therealong and each of the remaining sides that extend in the direction orthogonally thereto has one terminal located at mid-length thereof.

According to another aspect of the invention, the electronic component is a voltage source for supplying a reference voltage for an electronic measurement sensor. Specifically, the measurement sensor is a load sensor. Voltage sources for supplying a reference voltage, referred to in brief as voltage references, play a key role in the performance of the measurement sensor, in particular the load sensor or load cell. These voltage references set the precision standard. Configuring the aperture in accordance with the invention, considerably increases the stability of the voltage reference and thereby results in higher precision.

In preferred embodiments, the electronic component is a surface mount technology (SMT) component. In this case, the connection locations of the PCB and the connection terminals of the electronic component are preferably in the form of soldering pads. Alternatively, the invention is also applicable in through-hole-technology (THT), wherein rigid pins of the electric component are soldered into conductive holes formed in the PCB.

According to a further aspect of the invention, the aperture is plated. The plating covers at least the edge of the aperture in the thickness direction of the PCB to thereby form a seal against the penetration of humidity. Suitable plating materials include copper and/or gold.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical, similar, or equivalent features, and wherein.

DETAILED DESCRIPTION OF EXEMPLARY EMBODIMENT(S)

Figure 1:
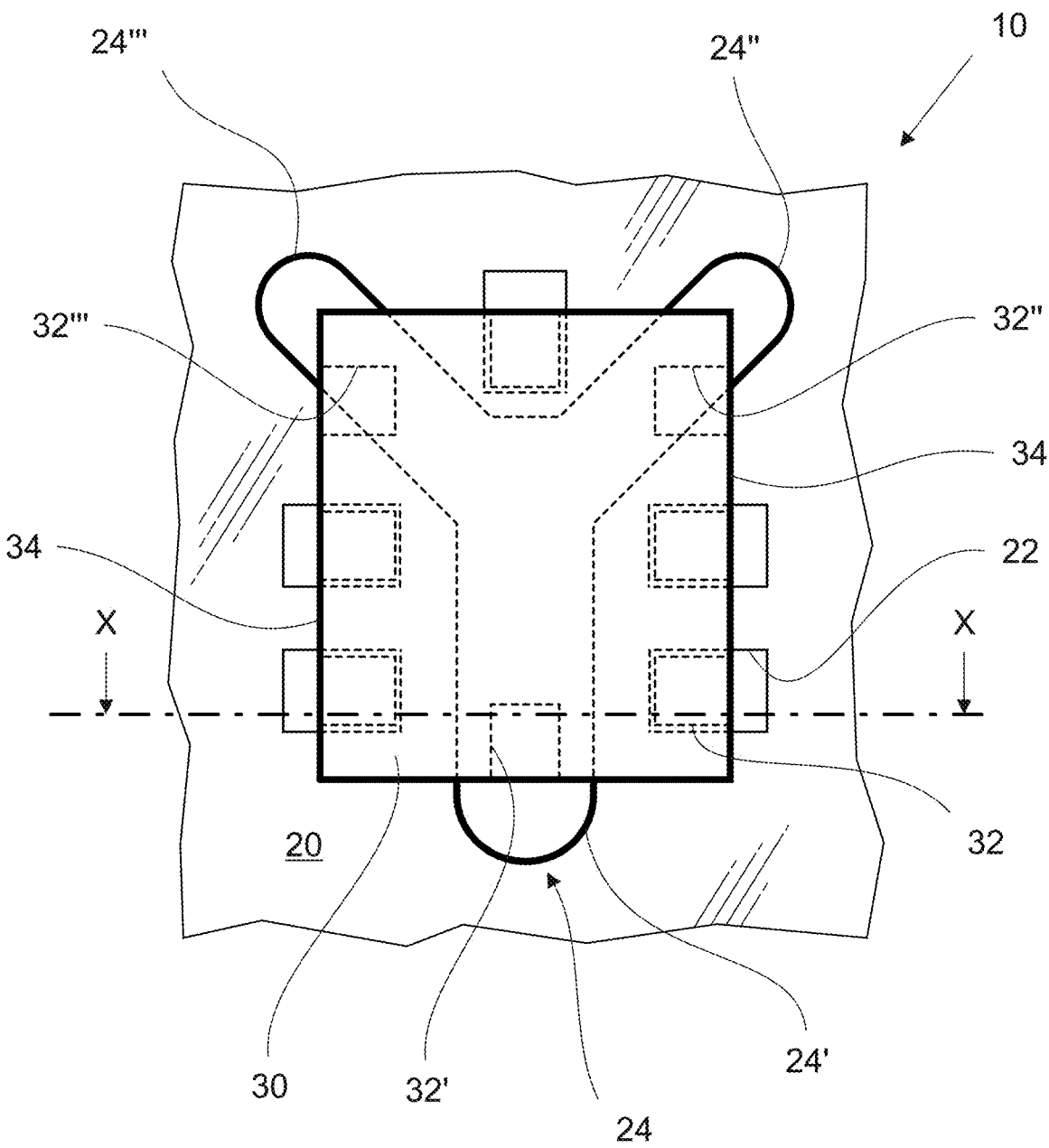
FIG. 1 illustrates a plan view of the upper side of a printed circuit board that has an electronic component mounted thereon.
Figure 2:
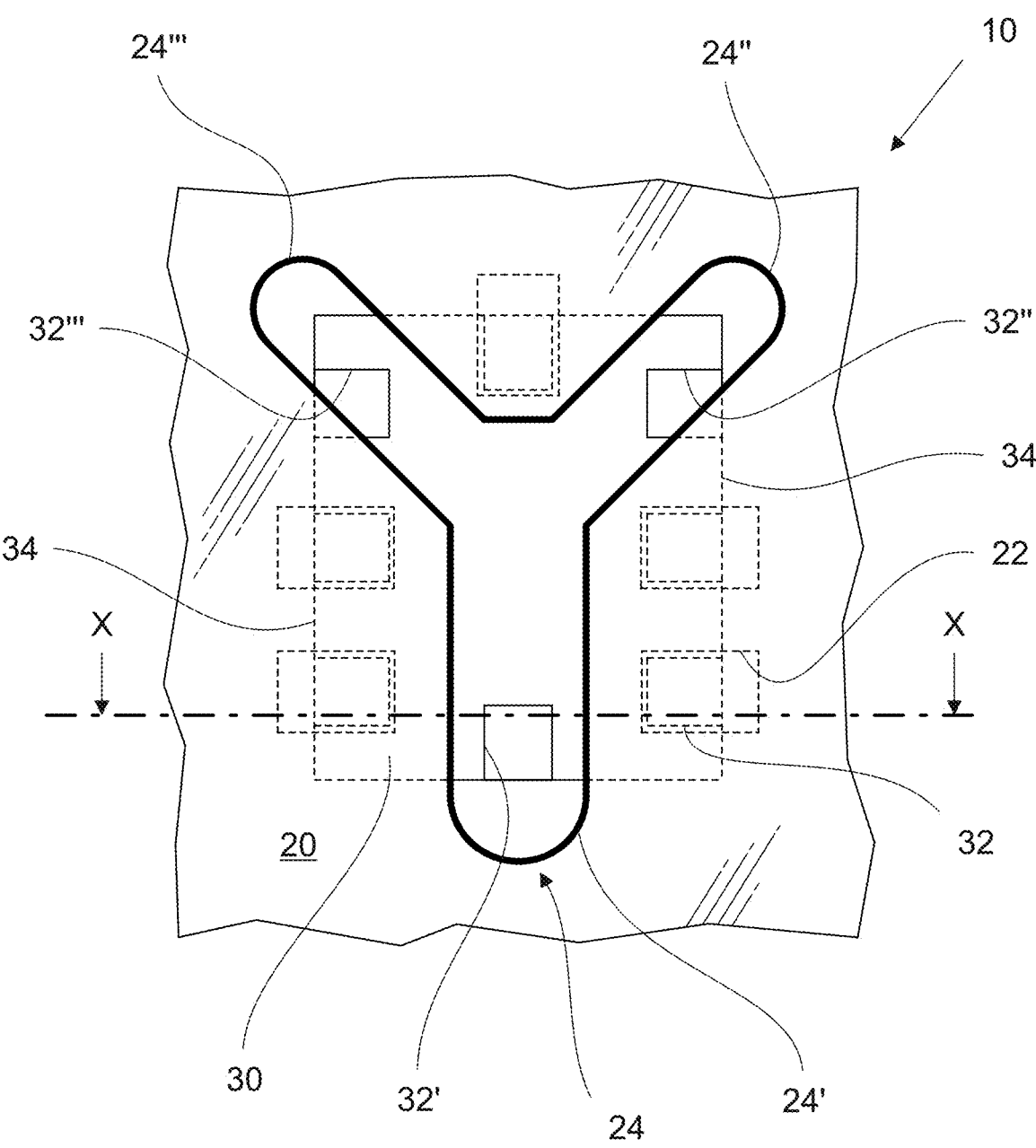
FIG. 2 illustrates a plan view of the lower side of the printed circuit board that is opposite to the one of FIG. 1.
Figure 3:
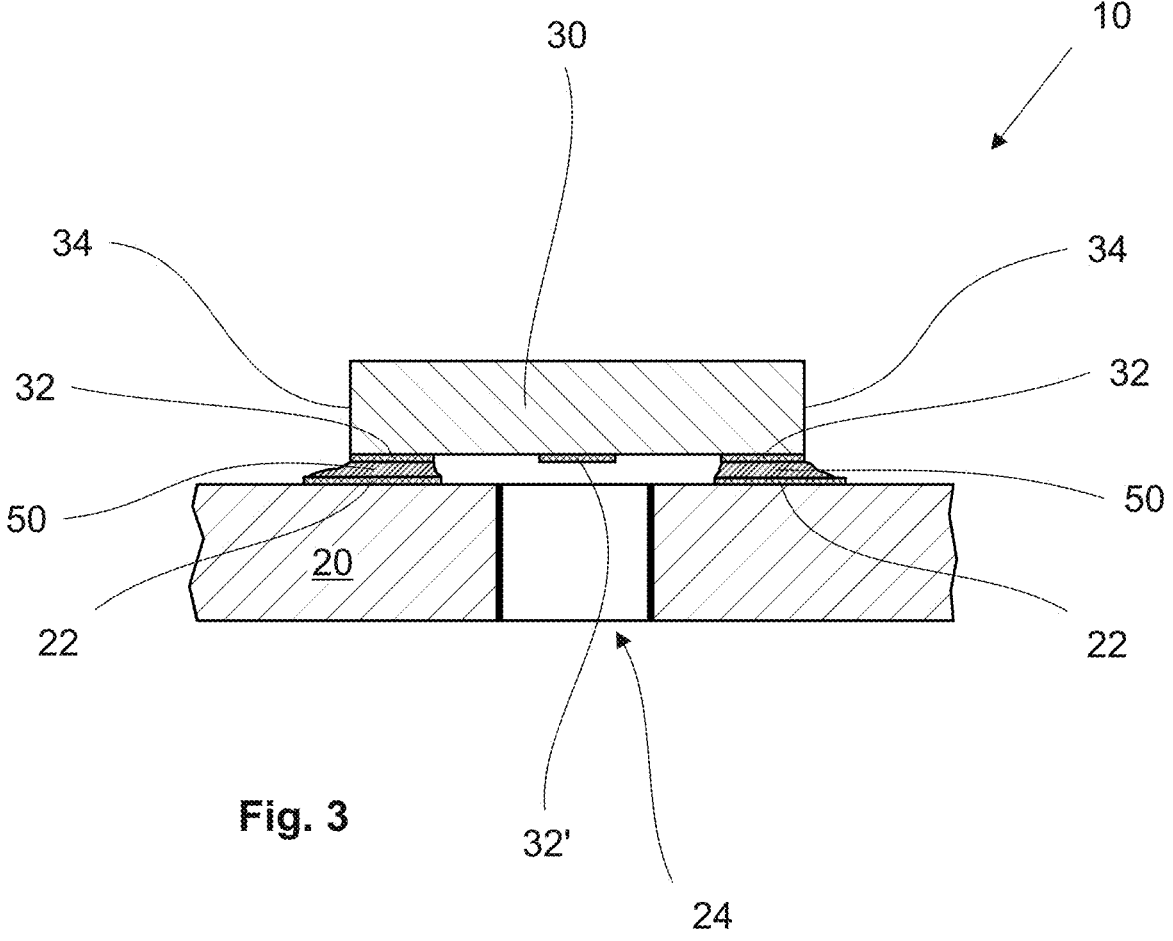
FIG. 3 illustrates a cross-sectional view according to the line X-X in FIGS. 1 and 2.

A printed circuit board assembly 10 comprises a printed circuit board (PCB) 20 and an electronic component 30 mounted thereon at a mounting portion thereof. FIGS. 1 to 3 illustrate a corresponding detail of the printed circuit board assembly 10. The electronic component 30 is schematically illustrated in FIG. 1 showing the upper side of the PCB 20 as a rectangle represented as a thick black line. FIG. 2 shows the opposite lower side portions of the rectangle that are not visible from the lower side are illustrated as dashed lines.

In the illustrated embodiment, the electronic component 30 comprises eight square-shaped connection terminals 32, 32', 32", and 32''' located at the lower side of the electronic component 30 that faces the upper side of PCB 20. Each of two sides 34 of the rectangle has three of the connection terminals 32, 32", and 32''' equidistantly arranged therealong, respectively. Each one of the remaining two connection terminals is arranged midway along the other two sides of the rectangle that extend orthogonally to the opposing sides 34, 34.

The PCB 20 has a Y-shaped aperture 24 formed therein that is represented in FIG. 2 as a bold black line. In FIG. 1 portions covered by the electronic component 30 are illustrated as dashed lines. As may be seen from FIGS. 1 and 2, aperture 24 is composed of a first branch 24' that extends along a rectilinear center line that coincides with a center line of the rectangle that extends parallel to its opposing sides 34, and of second and third branches 24", 24''', each having a rectilinear center line extending under the same angles in relation to the rectilinear center line of the first branch 24'. Each of the first, second and third branches 24', 24", and 24''' is of constant width in the direction that is orthogonal to its center line. The first, second and third branches 24', 24", 24''' join at their proximal ends. Their distal ends project beyond the inside of the rectangle to the outside thereof.

FIGS. 1 and 2 further show rectangular connection locations 22 of the PCB 20. Two of them face and are soldered to the connection terminals of the electronic component 30 that are located on the right side of the first branch 24', while further two of them face and are soldered to the two connection terminals located at the left side of the first branch 24'. In addition, a further connection location of the PCB 20 faces and is soldered to a connection terminal of the electronic component 30 that is located between the second and third branches 24" and 24'''. In contrast, connection terminals 32', 32", and 32''' that face the first, second and third branches 24', 24", 24''', respectively, are unconnected.

This is illustrated in more detail in FIG. 3 for the lowermost connection terminal 32' and its nearest neighbors in FIG. 1. The cross-sectional view of FIG. 3 shows the two connection terminals 32 located at the left and right sides 34, 34 of the electronic component 30 connected by soldering 50 to the facing connection locations 22 of the PCB 20. In contrast, connection terminal 32' located midway therebetween is freely exposed to the first branch 24' of aperture 24 and is unconnected.

The edge of the aperture 24 that extends between the upper side and the lower side of the PCB 20 in the thickness direction thereof is represented as a bold line. This is to schematically indicate a plating with an appropriate material, e.g., copper and/or gold, to seal the PCB against penetrating moisture. This coating may also further extend over adjacent regions on the upper and lower sides of the PCB 20.

LIST OF REFERENCE NUMERALS

10 printed circuit board assembly
20 printed circuit board (PCB)
22 connection location
24 aperture
24' branch
24" branch
24''' branch
30 electronic component
32 connection terminal
32' connection terminal
32" connection terminal
32''' connection terminal
34 side of rectangle
50 solder

What is claimed is:

1. A printed circuit board (PCB) assembly comprising:
a printed circuit board (PCB); and
an electronic component mounted on the PCB at a mounting portion thereof, the electronic component having a plurality of electrical connection terminals for soldering to corresponding connection locations of the PCB and the mounting portion having an aperture facing the electronic component mounted on the PCB;
wherein at least one of the terminals is unconnected and the aperture extends into a region of the PCB that faces the at least one unconnected terminal;
wherein the electrical connection terminals are arranged along the four sides of a rectangle with a first unconnected terminal located on a center line between two opposing sides of the rectangle and second and third unconnected terminals located opposite to each other in a direction that is orthogonal to the center line, and the aperture comprises first, second and third proximally contiguous branches distally facing the first, second and third unconnected terminals, respectively.

2. The PCB assembly of claim 1, wherein:
the second and third unconnected terminals are each located adjacent to a corner of the rectangle.

3. The PCB assembly of claim 2, wherein:

each of the two opposing sides has three terminals equidistantly located therealong and each of the remaining sides that extend in the direction orthogonal thereto has one terminal located at mid-length thereof.

4. The PCB assembly of claim 1, wherein:

each of the two opposing sides has three terminals equidistantly located therealong and each of the remaining sides that extend in the direction orthogonal thereto has one terminal located at mid-length thereof.

5. The PCB assembly of claim 1, wherein:

the electronic component is a voltage source for supplying a reference voltage for an electronic measurement sensor.

6. The PCB assembly of claim 5, wherein:

the measurement sensor is a load sensor.

7. The PCB assembly of claim 1, wherein:

the electronic component is a surface mount technology (SMT) component.

8. The PCB assembly of claim 1, wherein:

the aperture is plated.

9. A printed circuit board (PCB) assembly comprising:

a printed circuit board (PCB); and an electronic component mounted on the PCB at a mounting portion thereof, the electronic component having a plurality of electrical connection terminals for soldering to corresponding connection locations of the PCB and the mounting portion having an aperture facing the electronic component mounted on the PCB;

wherein at least one of the terminals is unconnected and the aperture extends into a region of the PCB that faces the at least one unconnected terminal;

wherein the electrical connection terminals are arranged along the four sides of a rectangle with a first unconnected terminal located on a center line between two opposing sides of the rectangle and second and third unconnected terminals located opposite to each other in a direction that is orthogonal to the center line, and the aperture comprises first, second and third proximally contiguous branches distally facing the first, second and third unconnected terminals, respectively;

wherein the second and third unconnected terminals are each located adjacent to a corner of the rectangle;

wherein each of the two opposing sides has three terminals equidistantly located therealong and each of the remaining sides that extend in the direction orthogonal thereto has one terminal located at mid-length thereof;

wherein the electronic component is a voltage source for supplying a reference voltage for an electronic measurement sensor;

wherein the measurement sensor is a load sensor;

wherein the electronic component is a surface mount technology (SMT) component.

10. The PCB assembly of claim 9, wherein:

the aperture is plated.

\* \* \* \* \*